Figure 2A:
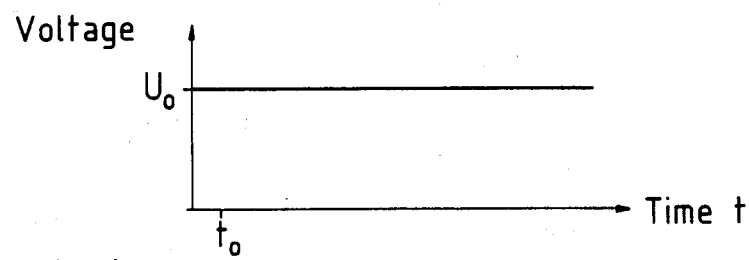

United States Patent [19]

Hoffmann et al.

[11] Patent Number: 4,724,338

[45] Date of Patent: Feb. 9, 1988

[54] GENERATION OF NARROW-BAND, DELAYED ELECTRICAL PULSES

[75] Inventors: Gerhard Hoffmann, Otterstadt; Dietrich Haarer; Elmar O. Mueller-Horsche, both of Bayreuth, all of Fed. Rep. of Germany

[73] Assignee: Basf Aktiengesellschaft, Ludwigshafen, Fed. Rep. of Germany

[21] Appl. No.: 755,416

[22] Filed: Jul. 16, 1985

[30] Foreign Application Priority Data

Jul. 17, 1984 [DE] Fed. Rep. of Germany ....... 3426196

[51] Int. Cl.[4] ........................ H03K 3/42; H01J 40/14; H01L 31/08
[52] U.S. Cl. ................................ 307/311; 250/211 R; 338/15
[58] Field of Search .................... 307/311; 338/15, 18; 250/211 R

[56] References Cited

U.S. PATENT DOCUMENTS

| | | | |
|---|---|---|---|
| 3,041,165 | 6/1962 | Süs et al. ............................... | 430/74 |
| 3,484,237 | 12/1969 | Shattuck et al. ....................... | 430/80 |
| 3,676,688 | 8/1969 | Sharples et al. ................. | 250/211 R |
| 4,228,354 | 7/1979 | Lehto et al. ........................... | 250/371 |
| 4,389,475 | 6/1983 | Hoffmann et al. ..................... | 430/58 |
| 4,396,695 | 8/1983 | Dimmler et al. ...................... | 430/58 |
| 4,419,427 | 12/1983 | Graser et al. .......................... | 430/58 |
| 4,430,158 | 2/1984 | Jackey et al. ........................ | 162/158 |

FOREIGN PATENT DOCUMENTS 1943773  8/1969  Fed. Rep. of Germany .

OTHER PUBLICATIONS

Physics and Applications of the Josephson Effect, A. Barone and G. Paterno, pp. 235–238 and pp. 264–290 (1982).

Primary Examiner—Stanley D. Miller
Assistant Examiner—Trong Quang Phan
Attorney, Agent, or Firm—Keil & Weinkauf

[57] ABSTRACT

Narrow-band electrical pulses which are delayed with respect to a first direct pulse produced are generated by a method in which space charges are pulsed in an electric field in a dielectric.

8 Claims, 12 Drawing Figures

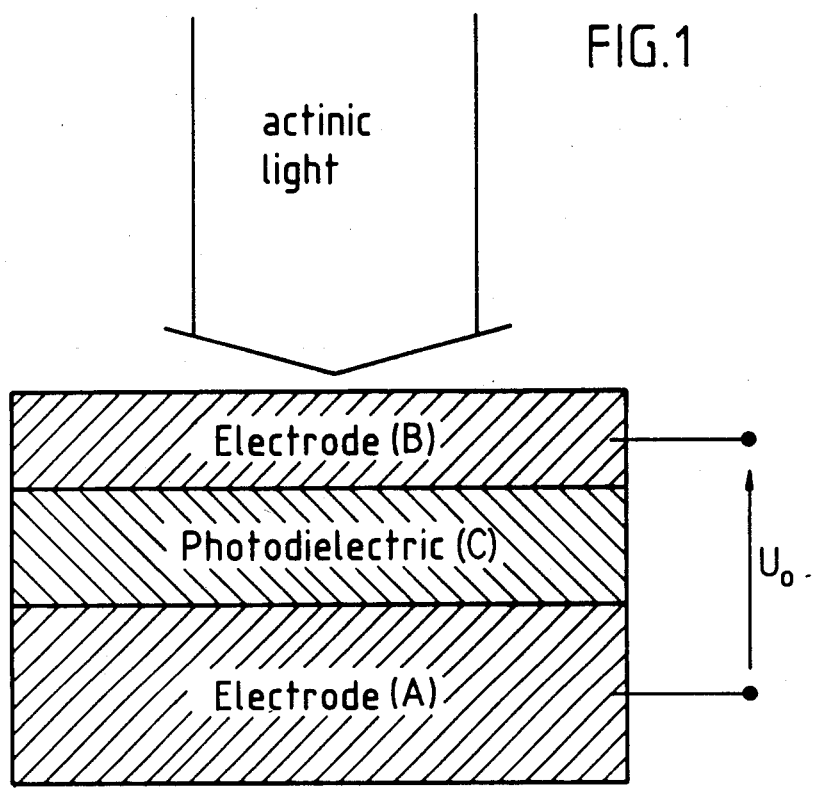

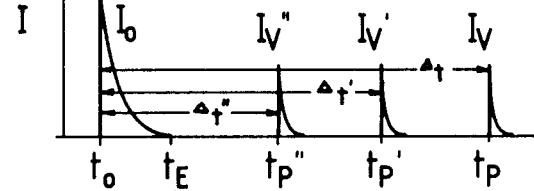
FIG.4a
FIG.4b
FIG.4c
FIG.4d

GENERATION OF NARROW-BAND, DELAYED ELECTRICAL PULSES

The present invention relates to a method for the generation of narrow-band electrical pulses which are delayed with respect to a first direct pulse. The narrow-band delayed pulses are generated by means of a non-linear switching element which possesses a dielectric, in particular a photodielectric.

Various methods for generating delayed electrical pulses are known. For example, an arrangement consisting of a light source which emits light pulses, a photodiode and a digital counter has been described, this arrangement emitting a delayed electrical pulse after a randomly set number of oscillator pulses. The implementation of this arrangement requires a large number of individual components and appropriate electrical adaptation. Actuation of the digital counter by means of a voltage pulse is likewise a prior art procedure and corresponds to the generation of electrical pulses by means of voltage pulses.

The generation of repetitive electrical pulses is also known. For example, Josephson junction devices, which are switching elements for generating repetitive electrical pulses without dispersion, i.e. without modification of the pulse form as a function of time, are discussed by A. Barone and G. Paterno in Physics and Applications of the Josephson Effect, pages 235-238 and pages 264-290, John Wiley and Sons (1982). The realization of such switching elements, which have to operate at, for example, liquid helium temperature, is technically extremely complicated.

The various prior art electrical arrangements for generating delayed electrical pulses not only have the disadvantage of being very expensive and in some cases having a very complex design and mode of operation, but are also only optimized for a particular mode of operation and can only be used for this.

It is an object of the present invention to provide a method for generating delayed electrical pulses which is technically simple to carry out, can be operated universally and can be integrated simply and cheaply into any electrical circuits.

We have found, surprisingly, that this object is achieved, in accordance with the invention, by a method of the type under discussion, in which space charges are pulsed in an electric field in a dielectric.

The present invention accordingly relates to a method for generating narrow-band electrical pulses which are delayed with respect to a first direct generated pulse, wherein space charges are pulsed in an electric field in a dielectric.

In a preferred embodiment of the novel method, a photodielectric is used.

In another particular embodiment of the method according to the invention, space charges are pulsed in a photodielectric by means of a light pulse comprising light having an actinic wavelength.

In another preferred version of the method, space charges are pulsed in a photodielectric by means of a voltage pulse.

In another, very advantageous embodiment of the novel method, space charges are pulsed, by means of a voltage pulse or a light pulse, in a photodielectric subjected to constant exposure to actinic light, in particular actinic light of variable intensity.

Using the novel method, it is possible to generate narrow-band delayed electrical pulses which have extremely little or no dispersion. For the purposes of the present invention, a pulse is in general any step function, and the term pulse embraces all pulse forms, for example from a very narrow rectangle to a rectangle of infinite width. Accordingly, pulsing is the controlled transmission of a pulse to a system from outside. Narrow-band means that the half width of the delayed electrical pulse generated in the system (delayed response) is very small compared with its delay time. The delay of the narrow-band pulses generated is relative to a first electrical direct pulse produced, ie. the first response pulse of the system (direct response), which occurs in a conventional manner directly after stimulation of the system, in the novel method directly after pulsing the space charges in the dielectric under the action of an electric field which is switched on. If, for example, a direct response is induced at time $t_O$ and dies away at time $t_E$, the novel method generates a delayed narrow-band electrical pulse (delayed response) at time $t_P$, the delay resulting in a difference $(t_P - t_O)$ and, according to the invention, being capable of being changed depending on the conditions selected. For example, the novel method can be used to obtain narrow-band delayed electrical pulses for which the time $t_P$ is very much greater than $t_E$; however, particularly where delayed repetitive pulses are being generated, $t_P$ may also be smaller than $t_E$, ie. may lie between $t_O$ and $t_E$.

The novel method can be carried out using very simple switching elements consisting of one or more dielectrics, in particular a photodielectric, possessing electrical connections (electrodes), as are known per se and belong to the state of the art. According to the invention, to generate the delayed narrow-band electrical pulses, an electric field is produced in the dielectric, for example by applying a voltage at the electrodes, and the space charges which are present in the dielectric, and those which may be generated there in the case of photodielectrics by exposure to actinic light, are pulsed in a suitable manner, for example electrically by means of a voltage pulse or photoelectrically by means of a light pulse from light of actinic wavelength, with induction of the direct pulse. During the direct pulse, or after this has decayed, and with the electric field still present, the switching element, depending on the mode of operation, then produces one or more delayed narrow-band electrical pulses in the dielectric, the time between the individual delayed pulses in each case being large compared with the pulse width.

Figure 2B:
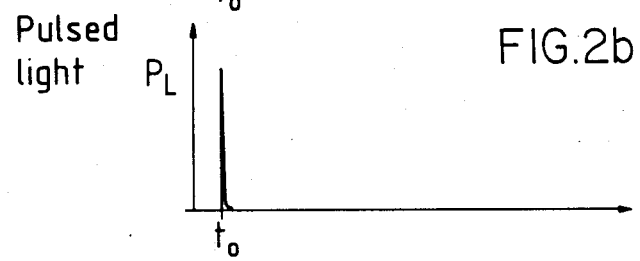
Figure 2C:
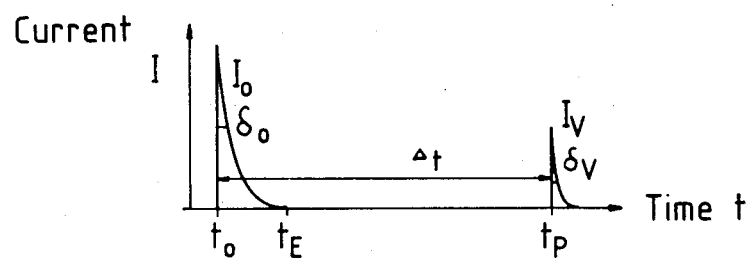
Figure 2D:
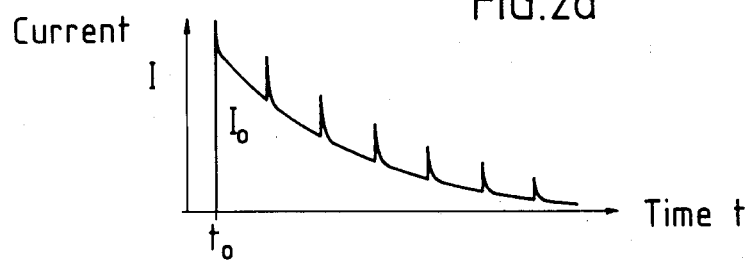
Figure 3A:
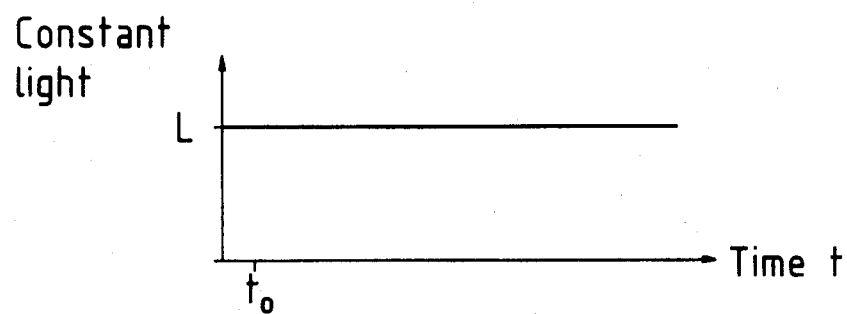
Figure 3B:
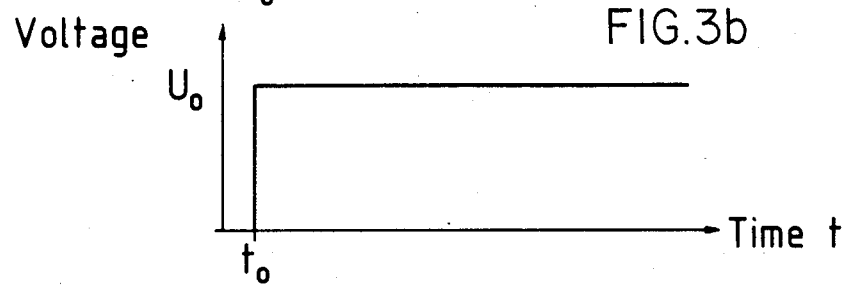
Figure 3C:
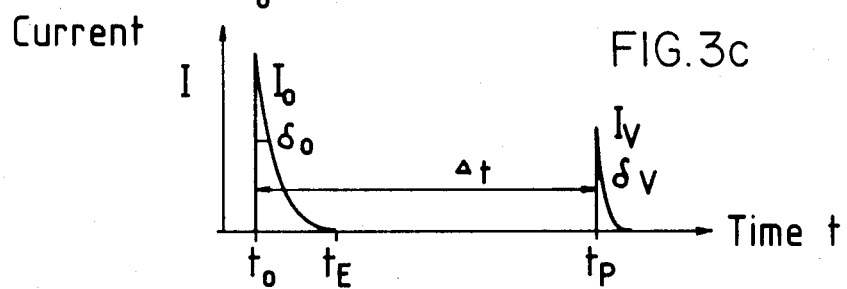

The novel method in general and various specific modes of operation of this method are illustrated below with reference to the drawings. In the drawings, FIG. 1 shows schematically the structure of a switching element as can be used for carrying out the method according to the invention, FIG. 2 illustrates the generation of delayed narrow-band electrical pulses in a photodielectric by means of a light pulse, FIG. 3 illustrates the generation of delayed narrow-band electrical pulses in a photodielectric by means of a voltage pulse, and FIG. 4 illustrates a possibility of controlling the delay time for the delayed narrow-band electrical pulses.

The method according to the invention can be carried out using a simple switching element as shown schematically in FIG. 1 by way of example. Such a switching element preferably contains a photodielectric material (C) between two electrodes (A) and (B) and in close contact with these. For carrying out the novel method, the thickness of the photodielectric (C) is in general from 2 to 100 um, preferably from 5 to 25 um. The first electrode (A), which has good electrical conductivity, is preferably such that it simultaneously imparts the required mechanical stability and dimensional stability to the switching element. This electrode (A) therefore advantageously consists of a mechanically stable material possessing good electrical conductivity, in particular a metallic or metal-coated base, e.g. gold, silver, aluminum foil, aluminum sheet, iron which is coated with gold by vapor deposition, polyester film coated with metal by vapor deposition, glass coated with a conductive indium oxide/tin dioxide layer (NESA glass), or any other electrically conductive, dimensionally stable materials. The second electrode (B) preferably consists of a material which possesses good electrical conductivity and at the same time is transparent to light of actinic wavelength, as is used for the constant exposure of the photodielectric and/or for the generation of the light pulses. Materials which are very suitable for this purpose include metal layers which are transparent to light, for example those which are applied directly to the photodielectric (C) by vapor deposition and consist of, for example, aluminum, gold or similar materials. In general, a layer thickness of about 3–50 nm is sufficient for the electrode (B). Other materials which are very advantageous as the second electrode (B) which is transparent to light include the abovementioned NESA glasses, which need only be brought into close contact with the photodielectric (C); the electrically conductive oxide coating of the NESA glasses is brought into direct contact with the surface of the photodielectric (C) and must possess contacts on the outside for connection to a voltage source. The said electrode (B) used may furthermore be a polyester film coated with aluminum by vapor deposition, provided that such a film is sufficiently transparent to light in the actinic wavelength range. In an embodiment of the invention, the said electrode (B) may furthermore be a quasi-electrode in the form of a surface charge applied by means of a corona.

In principle, any photodielectric which is known per se to the skilled worker and described in the literature may be used in the novel method as photodielectric (C), which is introduced into the switching element of FIG. 1 between the two electrodes (A) and (B) and is in close contact with these. Such photodielectrics include, in particular, crystalline photoconductors, amorphous organic photoconductors, homogeneous sensitized organic photoconductors, polymeric organic photoconductors, disperse sensitized organic photoconductors and layerwise-sensitized organic photoconductors (e.g. double-layer photoconductors), as summarized, for example, by W. Wiedemann, Chemiker-Zeitung 106 (1982), 275–287 and 313–326.

In the method according to the invention, particularly good results are obtained using organic photodielectrics based on charge-transfer complexes of the polymeric organic photoconductor type. This class of photodielectrics includes in particular the photoconductive layers based on poly-(N-vinylcarbazole), for example photoconductive layers consisting of 1 mole of poly-(N-vinylcarbazole) and from 0.5 to 1.5 moles of 2,4,7-trinitrofluoren-9-one, as described in, for example, U.S. Pat. No. 3,484,237.

Other preferred photodielectrics (C) are layerwise-sensitized photodielectrics which consist of a first layer containing pigments and/or dyes which produce charge carriers when exposed to actinic light, and a second layer containing compounds which transport charge carriers and preferably have a low molecular weight. The first layer containing charge carrier-producing pigments and/or dyes is in general from about 0.01 to about 0.4 $\mu$m thick and either consists only of the charge carrier-producing pigments and/or dyes or contains these bound in a binder. The second layer of these layerwise sensitized photodielectrics is usually about 2–40 $\mu$m thick and is generally composed of a mixture of from 20 to 70% by weight of one or more charge carrier-transporting compounds, generally having a low molecular weight, in from 30 to 80% by weight of a polymeric binder. This second layer containing the charge-transporting compounds may furthermore contain as much as 25% by weight, based on the layer, of further additives which improve the mechanical and/or electrical properties of the layer.

Such multilayer photodielectrics are known as such and are described in many publications, in particular in connection with the production of electrophotographic recording materials possessing double-stratum electrophotographic layers (cf. for example No. DE-A 2,220,408). Dyes and pigments which can be used in the multilayer photodielectrics and which produce charge carriers when exposed to actinic light include in principle all compounds of this type which are known to the skilled worker, eg. xanthene dyes, triarylmethane dyes, isoindolines, isoindolinones, perylene pigments, molecular disperse soluble perylene dyes, azo pigments containing oxadiazole rings, rhodamine dyes, eg. rhodamine B, phthalocyanines and many others (cf. No. EP-A-64,946, No. DE-A-3,110,954, U.S. Pat. Nos. 4,419,427, 4,396,695 and 4,389,475, No. EP-A 61,092 etc.). Suitable binders for the layer of the photodielectrics which contains the charge carrier-producing dyes or pigments are all polymers which possess good film-forming, mechanical and electrical properties, do not exhibit optical absorption in the actinic wavelength range of the charge carrier-producing dyes or pigments, and furthermore do not hinder charge transport. Examples of such compounds are polyvinyl chloride, polyesters, polyacetals, polycarbonates, polystyrene, copolymers of styrene with (meth)-acrylates and/or (meth)acrylic acid and/or maleic anhydride, cellulose derivatives and silicone resins. The styrene polymers and vinyl chloride polymers have proven particularly advantageous. Particularly suitable polymeric binders for the layer of the multilayer photodielectrics which contains the charge carrier-transporting compounds are polycarbonates, but styrene/maleic anhydride or styrene/(meth)acrylic acid copolymers which may contain, as copolymerized units, further comonomers, e.g. (meth)acrylates or small amounts of (meth)acrylic anhydride may also be used. Suitable charge carrier-transporting compounds for the photodielectrics are the compounds of this type which are known to the skilled worker, examples being oxazole derivatives (No. DE-B-1,120,875), oxadiazole derivatives (No. DE-B-1,058,836), triazole derivatives (No. DE-B-1,060,260), azomethines (U.S. Pat. No. 3,041,165), pyrazoline derivatives (No. DE-B-1,060,714), imidazole derivatives (No. DE-B-1,106,599) and hydrazone derivatives (No. EP-A-1,599). Charge-transporting compounds which have proven very advantageous in this context include the special hydrazone derivatives as described in No. DE-A-3,201,202, and 2-phenylbenzo-1,2-3-triazoles (No. DE-A-3,215,967 and DE-A-3,215,968), 2-phenyl-triazolopyrimidines (No. DE-A-3,304,330), 5,6-disubstituted benzotriazoles (No. DE-A-3,324,641) and other triazole derivatives. Examples of additives which can be added to the photodielectrics to improve the mechanical and/or electrical properties are plasticizers, eg. phthalates, terephthalates and the like, activators, eg. metal-1,3-diketone complexes or metal acetylacetonates, and other oligomeric and/or polymeric assistants.

The electrodes (A) and (B) of the switching element illustrated schematically and by way of example in FIG. 1 can also be connected to the photodielectric (C) via adhesive layers. This permits particularly firm and intimate contact between the electrodes and the dielectric. These adhesive layers must of course be essentially permeable to the charge carriers, and are known to the skilled worker from the literature.

To carry out the novel method using a switching element as shown in FIG. 1, the space charges which are inherently present, and any which may furthermore be produced by exposure to actinic light, are pulsed in the photodielectric (C) arranged between the two electrodes (A) and (B). Depending on the particular versions of the method, which are described in detail below, pulsing of the space charges can be effected in various ways, in particular electrically or photoelectrically. In any case, an electric field must be present in the photodielectric (C); this field can, for example, be switched on and developed in a simple manner by applying a d.c. voltage at the electrodes (A) and (B). The voltages applied to the dielectric in the novel method to switch on the electric field can vary within wide limits and are in general from about 10 to about 500 V. The delay of the narrowband delayed electrical pulses can be controlled via, inter alia, the size of the applied voltage. The current requirement is similar to that for conventional electrical switching elements. Suitable current and voltage sources are the conventional d.c voltage sources, for example batteries and the like. In the various embodiments of the method according to the invention, the photodielectrics are also exposed to actinic light in the form of a light pulse and/or are subjected to a constant exposure to actinic light. Actinic light in this cantext is light of a wavelength which is effective for the particular photodielectric used, ie. is capable of producing charge carriers therein. For the photodielectrics usually employed, the actinic light generally used can have a wavelength of from about 200 to about 800 nm. Suitable light sources are conventional sources of actinic light in this wavelength range. Examples of suitable light sources for constant exposure of the photodielectrics are fluorescent tubes and incadescent lamps, e.g. tungsten lamps, preferably those in which the radiation intensity can be controlled. For exposure of the photodielectrics to light pulses, it is preferable to use lasers which emit laser beams in the actinic wavelength range. The output pulse energies of the lasers are typically from about 1 μj to about 100 mj. The pulse energy required differs depending on the particular version of the method.

According to the invention, narrow-band delayed electrical pulses can be generated under the conditions described generally above, using various versions of the method which are described below. Version 1 of the method;

Narrow-band delayed electrical pulses are generated, by means of a light pulse, in photodielectric possessing an electric field switched on via an applied constant voltage.

In this version, the switching element employed is as shown in, for example, FIG. 1 and consists of a dimensionally stable electrode (A), an electrode (B) which is transparent to light, and a photodielectric (C) arranged between the electrodes. A voltage $U_o$, for example one of from 10 to 500 v, which does not vary with time is applied at the electrodes (A) and (B), and an electric field is therefore generated in the photodielectric (C). The course of the method over a period of time is shown in FIG. 2. After the voltage $U_O$ has been applied, the photodielectric (C) is exposed to a pulse $P_L$ of actinic light at time $t_O$ through the transparent electrode (B). This light pulse $P_L$ is of very short duration, e.g. usually of the order of nanoseconds, and has sufficient energy to pulse the space charges present in the photodielectric (C) and those produced by exposure to the light pulse. The minimum pulse energy required depends, inter alia, on the type of photodielectric (C). Usually, pulse energies of about $1$ uJ.cm$^{-2}$ or higher are employed. Various embodiments of this version of the process can be differentiated on the basis of the energy of the incident light pulse $P_L$.

In one embodiment of version 1 of the method, the space charges are pulse in the photodielectric (C) by means of an actinic light pulse $P_L$ of comparatively low pulse energy. The typical pulse energies employed here were from about $1$ $\mu J.cm^{-2}$ to about $0.1$ mJ.cm$^{-2}$. The associated current/time graph (FIG. 2a) shows that in this case pulsing of the space charges in the photodielectric (C) in the presence of an electric field results in a current pulse $I_O$ being produced immediately, i.e. at time $t_O$. This current pulse $I_O$ is the first direct pulse generated, i.e. the direct response of the system, and has a half life $\delta_O$, which falls to O at time $t^E$. When the voltage $U_O$ is further maintained at the electrodes (A) and (B), ie. when the electric field remains switched on, the switching element emits a further delayed current pulse $I_V$ after a time $t_p$. This delayed current pulse $I_V$ has a narrow band width, ie. its half width $\delta_v$ is substantially smaller than the delay $(t_P-t_O)$, which is the difference between the time at which the delayed current pulse $I_V$ occurs and the time at which the direct pulse $I_O$ is initiated; in FIG. 2a, this is designated $\Delta_t$. The half width $\delta_v$ of the delayed current pulse $I_V$ is frequently smaller than the half width $\delta_O$ of the direct pulse $I_O$; however, it may also be of the same order of magnitude. In this embodiment of version 1 of the method, the time $t_P$ at which the delayed current pulse $I_V$ occurs generally has a very much larger value than the time $t_E$ during which the direct pulse $I_O$ decays, i.e. this embodiment permits the generation of a very greatly delayed narrow-band electrical pulse. While the decay time $(t_E-t_O)$ of the direct pulse $I_O$ has been measured as, for example, less than 100 milliseconds, the delay $\Delta_t$ of the delayed pulse $I_V$ is of the order of a few hundred milliseconds.

In another embodiment of version 1 of the method, the space charges in the photodielectric (C) are pulsed by means of an actinic light pulse $P_L$ of comparatively high pulse energy, ie. the pulse energy in this case is substantially higher than in the case of the embodiment described above. In general, the pulse energies employed here are higher than about $0.5$ mJ.cm$^{-2}$, in particular from about 1 to 10 mJ.cm$^{-2}$. The current/time graph for this embodiment of version is shown in FIG. 2b. In this case, a series of equidistant current peaks appears, beginning at time $t_O$. These are located on the descending curve of the total current and can have a positive or negative sign. The first current peak, which occurs immediately at time $t_O$, is the direct pulse $I_O$, and this is followed by a large number of repetitive delayed current pulses whose half widths are once again smaller than the delay time. Hence, this embodiment of version 1 of the method can be used to generate sharp narrow-band equidistant repetitive delayed electrical pulses.

Version 2 of the method:

A delayed narrow-band electrical pulse is generated, in a photodielectric which may or may not be exposed to constant light having an actinic wavelength, by means of a voltage pulse generated by switching on an electric field.

This version of the method too is carried out using a photodielectric (C) which is arranged between a dimensionally stable electrode (A) and an electrode (B) which is transparent to light, as shown in FIG. 1. In version 2, the photodielectric (C) can be constantly exposed to light L of actinic wavelength through the transparent electrode (8), and the intensity of this constant light L can be altered within wide limits and is preferably variable. It has been found that in general intensities of the incident constant light L of up to about 100 $uW.cm^{-2}$ are sufficient. A typical working range for the constant light intensity is, for example, from about 10 to 100 $uW.cm^{-2}$. However, it is also possible in this version of the method for the intensity of the constant light L to be zero, ie. for the procedure to be carried out without constant exposure. FIG. 3 shows, by way of example, the course of version 2 for the method for the embodiment in which constant light L of a particular intensity is employed. However, the same results are obtained in principle if the intensity of the constant light L is varied, including the embodiment of version 2 in which the intensity of the constant light L is zero, ie. no constant exposure is employed. Regardless of whether or not constant exposure is employed, an electric field is produced in the photodielectric (C) at a time $t_O$ by applying, at the electrodes (A) and (B), a voltage $U_O$ which does not vary with time. This voltage is typically about 10-500 V, corresponding to the range stated generally above. The abrupt voltage jump (voltage step function) which occurs when the electric field is switched on in the photodielectric (C), which may or may not be exposed to the constant light L, causes pulsing of the space charges present in the photodielectric (C). This immediately (ie. at time $t_O$) generates a current pulse $I_O$ as the direct response of the system. As shown in FIG. 3, this direct pulse $I_O$ has a half width $\delta_O$ and falls to O during time $t_E$. While the voltage $U_O$ continues to exist at the photodielectric (C), ie. the electric field remains switched on, and, in the case of exposure to constant light L, the photodielectric (C) continues to be subjected to constant exposure to the actinic light L, a delayed narrowband electrical pulse (marked as current pulse $I_V$ in FIG. 3) is generated after a time $t_P$. The half width $\sigma_V$ of this pulse is very much smaller than the delay time $\Delta_t$, which is the difference $(t_P - t_O)$. Furthermore, the half width $\Delta_V$ of the delayed pulse $I_V$ is, in this case too, frequently smaller than or about the same size as the half width $\delta_O$ of the direct pulse $I_O$. Moreover, the delay time $\Delta_t$ for the delayed current pulse $I_V$ is likewise larger than the decay time $(t_E - t_O)$ of the direct pulse $I_O$, i.e. in this case too a greatly delayed electrical pulse is obtained. The delay time $\Delta_t$ in version 2 of the method is dependent on the intensity of the incident constant light L. The lower the intensity of the constant light L, the greater is in general $\Delta_t$. Accordingly, the longest delay usually occurs when the procedure is carried out without constant exposure. By varying the intensity of the constant light, it is therefore possible in this version of the method for the delay of the electrical pulses generated to be controlled in a simple manner.

Like version 1 of the method, version 2 also permits the generation of narrow-band delayed electrical pulses, and the delay and the strength of these pulses can be determined and fixed by the conditions, for example the choice of photodielectric, applied constant voltage $U_O$ and energy of the incident actinic light.

Version 3 of the method:

A narrow-band delayed electrical pulse is generated by means of an actinic light pulse in a photodielectric which is exposed to constant light of actinic wavelength and variable intensity and in which an electric field is simultaneously switched on by means of an applied constant voltage.

This version of the method is a modification of version 1. It offers the possibility of using version 2 to vary, and control within certain limits, the delay time for the occurrence of the narrow-band delayed electrical pulse, as shown in FIG. 4 which illustrates the course of the process over a period of time. Starting from a switching element of the type shown in FIG. 1, an electric field is first switched on in the photodielectric (C) by applying, at the electrodes (A) and (B), a voltage $U_O$, for example one of from 10 to 500 V, which does not vary with time. Furthermore, the photodielectric (C) is exposed to constant light L of actinic wavelength through the electrode (B) which is transparent to light, and the intensity of this constant light L can be varied. In general, intensities for the incident constant light L of up to about 100 $\mu W.cm^{-2}$ have proven sufficient, typical intensities used being about 10-100 $\mu W.cm^{-2}$. FIG. 4 shows three different operating states; in the first, the intensity of the constant light L is O, ie. the procedure is carried out without using constant light, in the second operating state constant light L' of low intensity is used and in the third state constant light L" of low intensity is used is employed. The first operating state thus corresponds to version 1 of the method described above. In addition to being exposed to the constant light L, the photodielectric (C) is exposed to a light pulse $P_L$, for example in the form of a laser pulse, at time $t_O$, through the electrode (B) which is transparent to light. This light pulse $P_L$ is of very short duration, usually of the order of nanoseconds. To achieve a pronounced effect, the incident pulsed light is generally of low intensity, for example not more than 0.1 $mJ.cm^{-2}$, in particular from 1 $\mu J.cm^{-2}$ to 0.1 $mJ.cm^{-2}$. The power W of the incident pulsed light $P_L$ is substantially higher than that of the constant light W (L) incident at the same time, so that, to a first approximation, the light powers obey the following relationship: W $(P_L)$ + W $(L) \approx$ W $(P_L)$. The light pulse $P_L$ generates a first current pulse, the direct pulse $I_O$, immediately at time $t_O$. This pulse decays within a time $t_E$. When the voltage $U_O$ is maintained, ie. the electric field remains switched on, and exposure to the constant light L is continued, a current pulse delayed with respect to the direct pulse $I_O$ (time = $t_O$) is generated, similarly to versions 1 and 2 of the method. The delay time for this delayed pulse, ie. the time span between time $t_O$ and the time at which the delayed current pulse occurs is critically dependent on the intensity of the incident constant light L. If the intensity of this light is O, a delayed current pulse $I_V$ occurs at time $t_P$ (corresponding to version 1 of the method, FIG. 2a). The delay time $\Delta_t = (t_P - t_O)$ is the greatest in this case. If, on the other hand, the photodielectric (C) is additionally exposed to constant light of a particular intensity, the delay time for the delayed current pulse is reduced, this reduction being the greater the higher the intensity of constant light L. As shown in FIG. 4, a delayed current pulse $I_{V'}$ is generated at a time $t_{P'}$, which is smaller than the time $t_P$ in the case of constant light L' of lower intensity. The delay time $\Delta_{t'}$ for this delayed current pulse $I_{V'}$ is smaller than the delay time $\Delta_t$ for the delayed current pulse $I_V$ which is generated without constant exposure. If exposure to constant light L'' of higher intensity is chosen, the associated delayed current pulse $I_{V''}$ is shifted to a smaller time $t_{p''}$. As in the case of versions 1 and 2 of the method, the delayed electrical pulses generated are narrow-band pulses in this case too, ie. their half life is small compared to their delay time. Moreover, the delay time is large compared with the decay time $(t_E - t_O)$ of the direct pulse $I_O$, and the half width of the delayed pulse is frequently smaller than or of the same order of magnitude as that of the direct pulse $I_O$. Variation of the intensity of the constant light L has no significant effect, if any at all, on the intensity, the half width and the narrowness of the delayed current pulse $I_V$, but only affects the time $t_P$ at which this delayed current pulse $I_V$ occurs. Version 3 of the method therefore clearly permits the delay period to be controlled in the generation of narrow-band delayed electrical pulses.

The procedure for the novel method is not restricted to the particularly significant and technically important versions described above but can of course be varied over a wide range. For example, further embodiments or modifications of the versions described are possible, such as variants of the type and structure of the switching element. For example, it is possible to replace the photodielectric with another dielectric having inherent space charges, for example a polyester film, and to carry out pulsing of the space charges by means of a voltage pulse, according to version 2 of the method. Moreover, it is not necessary for the voltage $U_O$ applied to the switching element to remain absolutely constant with time; this voltage can, for example, increase or decrease. In another interesting modification of versions 1 and 3 of the method described above, the switching element consists only of the electrode (A) and the photodielectric (C), and the electrode (B) is replaced by a quasi-electrode in the form of surface charge applied by means of a corona. Since in this case an electric field is already produced in the dielectric by spraying on the surface charge, the application of an external voltage $U_O$ is dispensed with, ie. after the surface charge has been sprayed on by means of a corona, the photodielectric is exposed to pulsed light and, if required, also to constant light in the manner stated in the versions of the method discussed above. Other possible modifications and embodiments can be derived by the skilled worker from the embodiments described and are likewise worker from the embodiments described and are likewise embraced by the novel method, even if they are not mentioned specifically.

Using the method according to the invention, narrow-band electrical pulses which are delayed with respect to a direct pulse can be generated in a very simple, exactly reproducible manner. The switching elements employed in this method have a very simple structure, are cheap to produce, withstand handling and operation, are simple to operate and can be readily integrated into any circuits. Examples of fields of use of the novel method are opto-electronic circuits in the area of analog and digital circuits, and optical information processing.

The Examples which follow illustrate the invention.

EXAMPLE 1

A solution I was prepared from 2.5 g of a polycaprolactam (melting point 220° C.) and 5.0 g of rhodamine B (C.I. 45,170) in 1,000 g of a solvent mixture consisting of 60 per cent by volume of water and 40 per cent by volume of methanol. A finely brushed 0.3 mm thick aluminum sheet was coated with this solution I so that, after evaporation of the solvent in the air and drying for 30 minutes at 95° C., a film 0.15 $\mu$m thick resulted on the aluminum (charge carrier-producing layer = layer I).

A solution II containing 60 g of a styrene/acrylic acid copolymer (80% by weight of styrene, 20% by weight of acrylic acid; number average molecular weight: 2,800) and 40 g of 2-(4-diethylaminophenyl)-benzo-1,2,3-triazole in 900 g of tetrahydrofuran was applied in the same thickness onto this layer I. Evaporation of the solvent in the air and drying for 30 minutes at 70° C. gave a layer 4.5 um thick (charge carrier-transporting layer = layer II).

A very thin layer of gold, which was still transparent to light, was then applied by vapor deposition onto this layer II under greatly reduced pressure. The resulting switching element comprised a first electrode of aluminum, a second, gold electrode which was transparent to light, and a two-layer photodielectric arranged between these two electrodes.

A voltage $U_O$ of 300 V was applied at the electrodes of this switching element by means of a d.c. voltage source. The photodielectric (layer I + layer II) was then exposed to a laser pulse having a wavelength of 580 nm through the gold electrode, the energy of the laser pulse being 85 $\mu$J.cm$^{-2}$ and the pulse lasting for 10 nanoseconds. The incident laser pulse (at time $t_O$) immediately produced a first current pulse (direct pulse $I_O$) which was measured at about 0.3 $\mu$A; this first current pulse $I_O$ had decayed to O first about 50 milliseconds. After about 320 milliseconds, calculated from time $t_O$, a sharp delayed current pulse $I_V$ of about 0.08 $\mu$A was measured. The delayed current pulse $I_V$ was very narrow, and had decayed to O after about 20 milliseconds. The curve and appearance of the direct pulse $I_O$ and of the delayed pulse $I_V$ corresponded to FIG. 2a.

EXAMPLE 2

A 0.08 $\mu$m thick nylon barrier layer (melting point 255° C.) was applied onto an 80 $\mu$m thick polyester film which had been coated on one side with a 30 nm thick aluminum layer by vapor deposition. A solution of 26.64 parts by weight of poly-(N-vinylcarbazole), 31.5 parts by weight of 2,4,7-trinitrofluoren-9-one and 2.3 parts by weight of dimethyl terephthalate in 544 parts by weight of tetrahydrofuran was applied onto this barrier layer so that when the solvent had been evaporated off and drying had been carried out for 90 minutes at 85° C., the resulting dry layer was 10 $\mu$m thick. An aluminum layer transparent to light was then additionally applied by vapor deposition onto the photodielectric layer produced in this manner.

The two aluminum layers of the switching element thus obtained were provided with contacts and connected to a d.c. current source at a voltage of 400 V. The photodielectric layer was then exposed to a laser pulse having a wavelength of 308 nm through the transparent aluminum layer, the laser pulse having a duration of 10 nanoseconds and an energy of 1 mJ.cm$^{-2}$. After a first current pulse $I_O$, which occurred directly on exposure to the laser pulse, 12 repetitive delayed current pulses were measured, these pulses being located on the descending curve of the total current. The repetitive delayed current pulses were narrow and equidistant, with a spacing of about 0.65 microsecond. The current-/time graph recorded corresponded to the schematic picture shown in FIG. 2b, although the repetitive delayed pulses were of the opposite sign to the direct pulse $I_O$.

We claim:

1. A method of generating narrow-band delayed pulses which comprises:
    subjecting a dielectric positioned between two electrodes and in close contact with said electrodes to an electrical field; and thereafter
    applying a narrow-band light pulse to the dielectric to produce a pulsed space charge within said dielectric, whereby a second and delayed narrow-band electrical pulse is produced.

2. The method of claim 1, wherein a photodielectric is employed.

3. The method as claimed in claim 2, wherein the space charges are pulsed by exposure to actinic light.

4. The method as claimed in claim 2, wherein a photodielectric based on a polymeric organic photoconductor is used.

5. The method as claimed in claim 2, wherein a two-layer photodielectric which has a charge carrier-producing layer and a charge carrier-transporting layer is used.

6. The method of claim 1, wherein direct current illumination is also applied to the dielectric, whereby the spacing between the pulses can be controlled.

7. A method of generating narrow-band delayed pulses which comprises:
    applying direct current illumination to a dielectric positioned between two electrodes and in close contact with said electrodes; and thereafter
    subjecting the dielectric to an electric field pulse to produce a pulsed space charge within the dielectric, whereby a second and delayed narrow-band electrical pulse is produced.

8. The method as claimed in claim 7, wherein space charges are pulsed by means of a voltage or light pulse in the presence of an electric field in a photodielectric which is exposed to constant light of actinic wavelength.

* * * * *